(12) United States Patent
Duval et al.

(10) Patent No.: US 6,593,578 B1
(45) Date of Patent: Jul. 15, 2003

(54) WIEN FILTER FOR USE IN A SCANNING ELECTRON MICROSCOPE OR THE LIKE

(75) Inventors: Paul J. Duval, Lexington, MA (US); Allan I. Rubin, Newton, MA (US); Ira Rosenberg, Andover, MA (US); Vladimir Vayner, Needham, MA (US); Neal T. Sullivan, Lunenburg, MA (US)

(73) Assignee: Schlumberger Technologies, Inc., San Jose, CA (US)

( * ) Notice: Subject to any disclaimer, the term of this patent is extended or adjusted under 35 U.S.C. 154(b) by 49 days.

(21) Appl. No.: 10/010,321

(22) Filed: Nov. 8, 2001

(51) Int. Cl.⁷ .................................................. H01F 7/00
(52) U.S. Cl. ................. 250/396 ML; 335/210
(58) Field of Search ................... 250/396 ML; 335/210

(56) References Cited

U.S. PATENT DOCUMENTS

| | | | | |
|---|---|---|---|---|
| 4,658,136 A | * | 4/1987 | Ohtaka et al. ............... | 250/310 |
| 4,962,313 A | * | 10/1990 | Rose ........................... | 250/311 |
| 5,376,792 A | * | 12/1994 | Schamber et al. ........... | 250/311 |
| 5,422,486 A | * | 6/1995 | Herrmann et al. ........ | 250/396 R |
| 5,729,022 A | * | 3/1998 | Veneklasen et al. . | 250/396 ML |

FOREIGN PATENT DOCUMENTS

JP          11233062 A      *  8/1999       ............ H01J/49/48

OTHER PUBLICATIONS

Wien, W., Ann. Phys. 65 (1898), p. 444.*

* cited by examiner

Primary Examiner—John R. Lee
Assistant Examiner—Erin-Michael Gill
(74) Attorney, Agent, or Firm—Cohen, Pontani, Lieberman & Pavane

(57) ABSTRACT

A charged particle filter such as a Wien filter in which components used as the pole pieces and electrodes are precisely and reliably secured to a supporting structure through which they extend and to which they are brazed. Electrical insulating gaps in the magnetic circuit are located very remotely from the pole faces of the pole pieces so as to minimize any adverse effect of the gaps on the produced magnetic field.

21 Claims, 4 Drawing Sheets

WIEN FILTER FOR USE IN A SCANNING ELECTRON MICROSCOPE OR THE LIKE

FIELD OF THE INVENTION

The present invention is directed to a Wien filter used, for example, in a scanning electron microscope ("SEM") and, in particular, to an improved design for minimizing aberrations that affect the primary electron beam to thereby improve instrument resolution.

BACKGROUND OF THE INVENTION

Various instruments are known which rely on emission of charged particles from a sample to derive characteristics of the sample. Examples of such instruments are electron microscopes (e.g., scanning electron microscopes), focused ion beam microscopes, and mass spectrometers which utilize various well known means to analyze charged particles emitted from the sample.

For facilitating the description of the present invention, it will be explained in connection with an SEM. However, it should be understood that the invention is not limited to an SEM and can be applied by one with ordinary skill in the art to other instruments such as those mentioned above.

An SEM operates by generating a primary scanning electron beam that impacts a sample a surface of which is being imaged. As a result, backscattered and secondary electrons are emitted from the sample surface and have respective trajectories backward along the original beam direction which is perpendicular to the sample surface (known as the on-axis direction) and at angles diverging therefrom. Emitted electrons are collected by a detector, which is arranged above the sample. The detector generates a signal from the electron emission collected from the sample surface as it is exposed to the electron beam. The signal from the detector is typically processed to create an image of the surface, which is then displayed on a video screen.

With structures such as high aspect-ratio trenches and contact holes, the only electrons able to escape are those emitted on-axis. However, standard SEMs do not readily detect on-axis emitted electrons. This is because the detector must be spaced from the axis so as not to impede the primary, or incident, beam. In that position, on-axis electrons do not impinge upon the detector. Also, the high voltage on the front surface of the detector, which is commonly used to attract the secondary electrons, may adversely affect the primary beam.

The term "filter" as used herein refers to devices used to in some way separate, or disperse, the particles of a charged particle beam through their inherent differences in either velocity (although often, in fact usually, this quantity is classified as "energy"), charge, or mass. This can be done through application of either electric or magnetic fields, or a combination of both.

Wien filters have long been known (see W. Wien, *Ann. Phys.* 65 (1898), page 444). In such a filter, electrodes and magnetic poles are simultaneously utilized to create both an electric field and a magnetic field. The two fields are tuned, or adjusted, to apply equal and opposite forces to electrons in the incident beam, so that it is not deflected. However, an electron moving in the direction opposite to the incident beam will be oppositely affected by that same magnetic field force, which acts on such electron in the same direction as the electric field force. Thus, that electron will be deflected away from the beam axis. In that way, even the on-axis particles can be detected as they are deflected to a properly positioned detector.

U.S. Pat. No. 4,658,136 of Apr. 14, 1987, entitled "Secondary Electronic Detecting Apparatus" suggests the use of a Wien filter in a scanning electron microscope, but in practice Wien filters have not been used in that application because they have caused relatively small but significant disturbances in the electrostatic and magnetic fields through which the particles of the primary beam and the emitted particles pass, thereby disturbing the trajectories of such particles, which disturbances have been sufficient to undesirably degrade the primary beam and hence the resolution of the SEM. More specifically, the use of a Wien filter in an SEM requires that the magnetic and electrostatic fields be precisely matched and uniform in order to ensure that the primary electron beam is unperturbed and aberrations are kept to a minimum.

SUMMARY OF THE INVENTION

One object of the present invention is to provide a filter that generates electrical and magnetic fields which is constructed so as to significantly minimize aberrations that are due to mismatching of the electric and the magnetic fields, so that when the filter is used in combination with an SEM or the like, resolution of the instrument is not degraded to any appreciable degree.

Another object is to provide an external magnetic and electric field clamp, located adjacent to (above and below) the pole pieces to further improve the field shapes.

A further object of the present invention is to so construct a filter that its parts can be readily assembled to produce a precision structure which is physically and electrically stable under operating conditions.

Another object of the present invention is to provide a filter that has electric and magnetic fields which are uniform and precisely matched, thereby to effectively and accurately function in an SEM or the like.

Another object is to place the connectors to the poles and coils outside of the vacuum to facilitate manufacturing and eliminate outgassing from the coils.

These and other objects are attained by one aspect of the present invention directed to an improvement in an electromagnetic filter comprising a field-producing structure at least partly surrounding a passage. The improvement comprises a supporting structure around the passage having a plurality of inwardly extending openings therethrough. Each of a plurality of magnetically permeable field-producing structures extends continuously through one of the openings, terminating at one end in a pole face located radially inwardly from the supporting structure and constituted at its other end by a portion extending radially outwardly from the supporting structure. Each of the field-producing structures engages the supporting structure. Electromagnetic field-producing elements are operatively connected to the radially outwardly extending portions of the field-producing structures and are effective to act on the field-producing structures to produce magnetic and/or electric fields emanating therefrom and extending into the passage. The filter is adapted to function in combination with magnetic circuit means located outside the supporting structure for operatively engaging and coupling the radially outwardly extending portions of the field-producing structures with a gap between the field-producing structures and the magnetic circuit means, the gap being located radially outside the supporting structure.

In accordance with the present invention, a novel arrangement of the component parts of the filter is provided. In particular, the gap in the magnetic circuit which is required for electrical isolation is properly located so that the fringe magnetic fields associated with it, which otherwise tend to perturb the fields acting on the particles passing through the filter, do not create any deleterious effects on resolution.

We have discovered that locating the radial gap in the magnetic circuit near the central axis of the instrument produces undesirable disturbances in the magnetic field, which in turn adversely affect the resolution of the instrument. More specifically, a higher and more uniform and more stable magnetic field results when the radial gap is located laterally outside the structure which supports the pole pieces as far as possible from the axis of the beam and, even more preferably, outside the windings mounted on the pole pieces. These improvements in function are achieved by a structure which is comparatively simple, sturdier and more reliable than prior art Wien filter structures.

As indicated above, while the filter of the present invention is here specifically described for use with a scanning electron microscope, in connection with which its improved function is exceedingly important, it will be understood that the utility of the filter under discussion is not limited to that application, but is also advantageous in connection with most instruments where charged particles move through the same space in different directions and are to be differently acted upon depending upon the particular direction in which they are moving.

BRIEF DESCRIPTION OF THE DRAWINGS

To the accomplishment of the above, and to such other objects as may hereinafter appear, the present invention relates to the construction of a filter as defined in the appended claims and as described in this specification, taken together with the accompanying drawings, in which:

DETAILED DESCRIPTION OF THE PREFERRED EMBODIMENT

The filter of the present invention, generally designated A, is, when used with an SEM, mounted in an external field clamp structure generally designated B (see FIG. 4) which defines a passage generally designated C through which the particles to be detected pass.

The filter A comprises a plurality of pole pieces generally designated D, here shown as eight in number, arranged around the passage C. In order to properly mount and locate the pole pieces D, a supporting structure generally designated E is provided in the form of a sturdy ring which surrounds the passage C. That ring E may be formed of non-magnetic structural material such as ceramic. An alumina material, 99% $Al_2O_3$, has been found to be effective for this purpose since it can be accurately formed and has the desired strength and mechanical stability. As can be seen from FIG. 3, the ceramic ring E is provided with a plurality of equally spaced and radially oriented through-openings 4 with, at the radially outer ends of the openings 4, outwardly facing bearing surfaces 6 of appreciable area.

Figure 1:
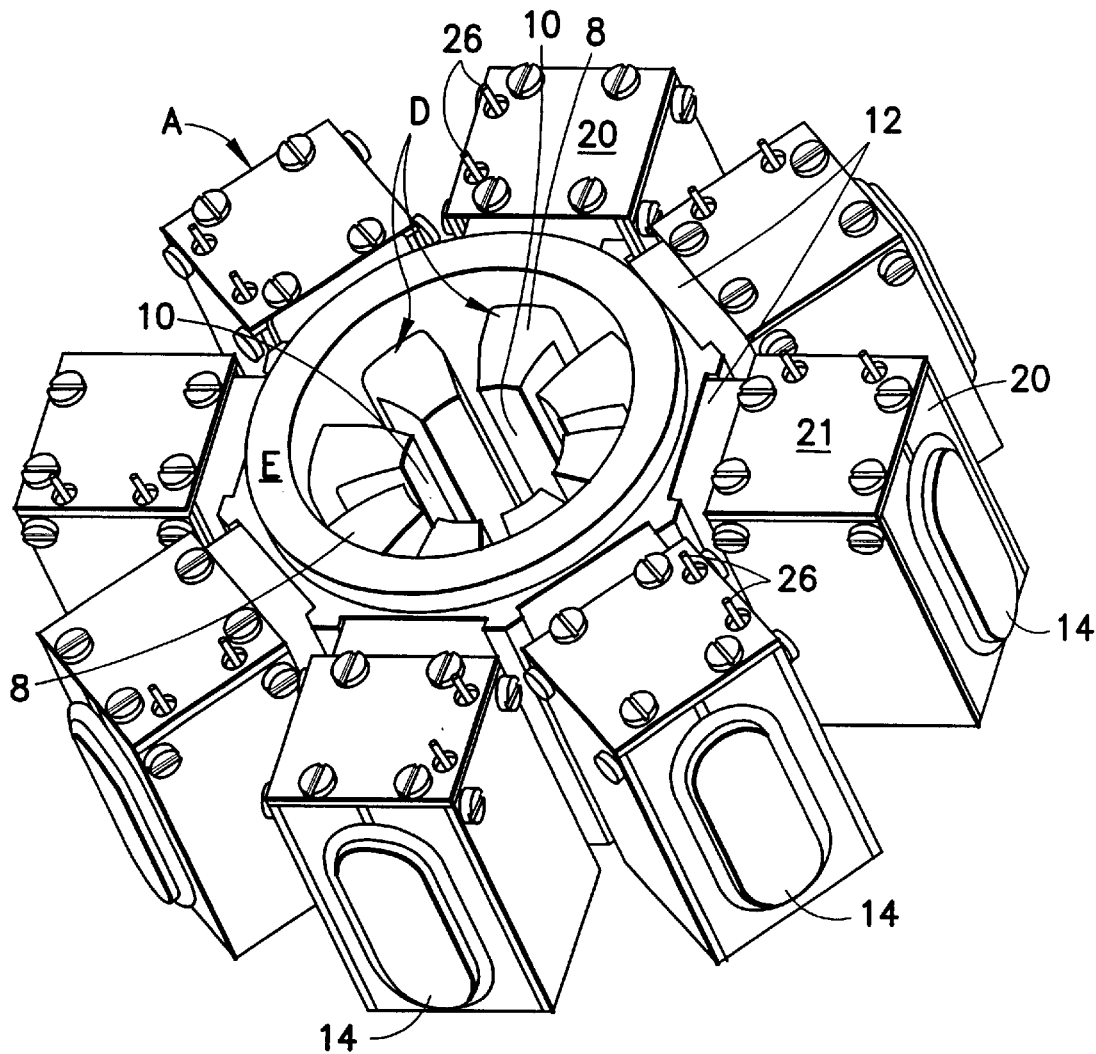
FIG. 1 is a perspective view of a Wien filter constructed according to the present invention.
Figure 2:
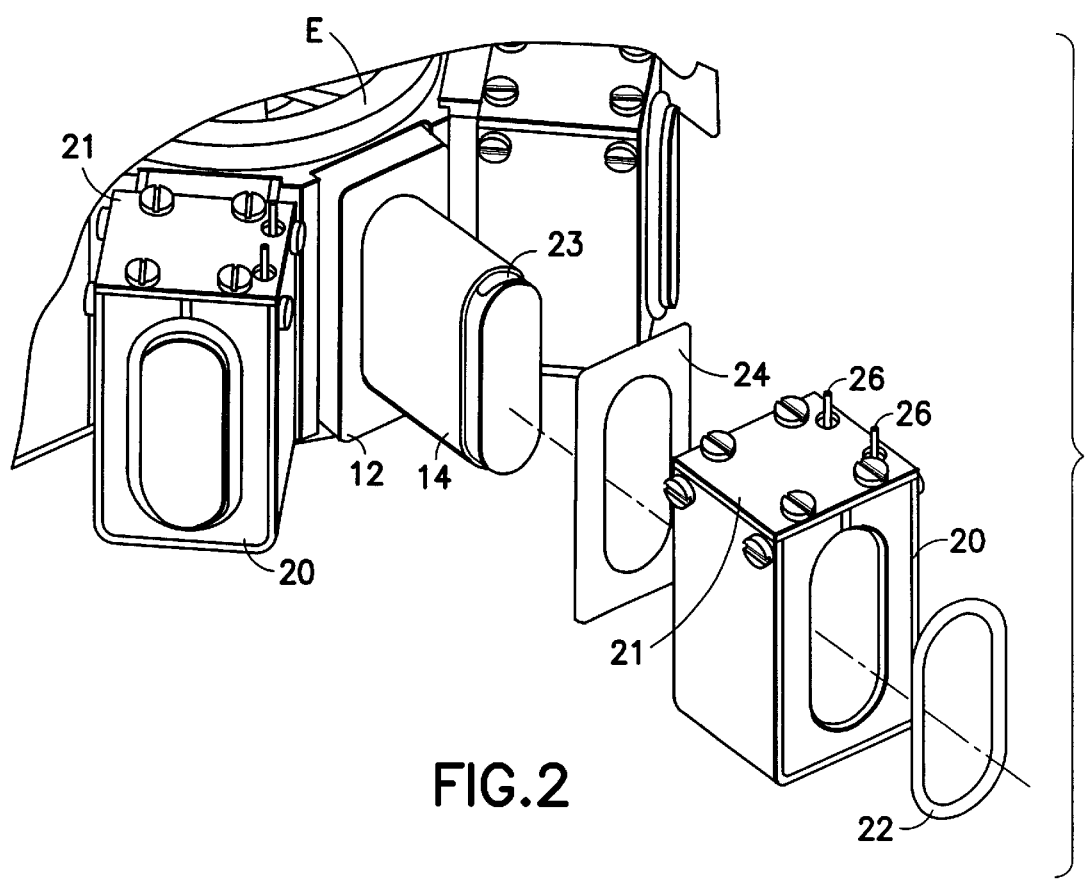
FIG. 2 is a fragmentary view of FIG. 1 showing one of the pole pieces in an exploded fashion.
Figure 3:
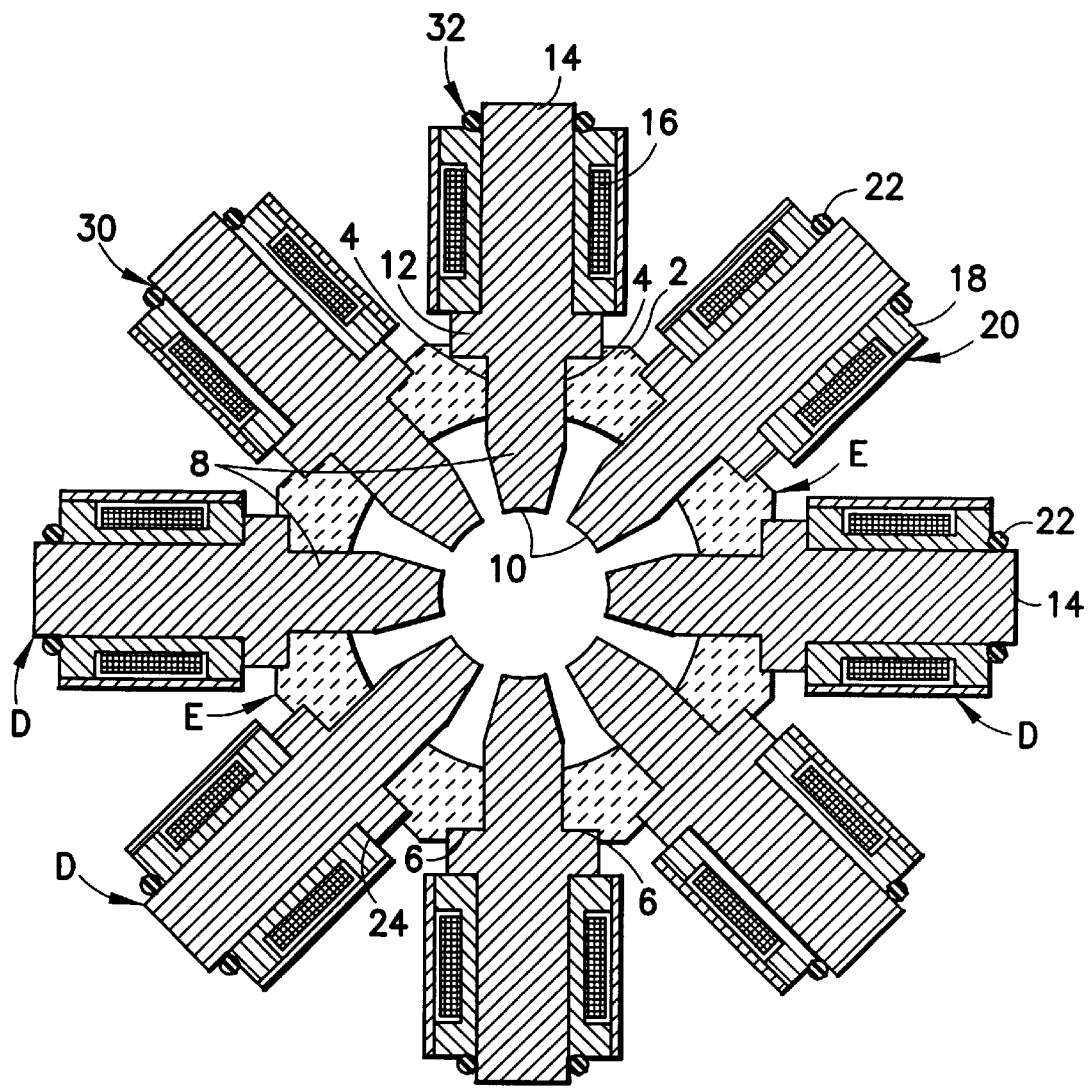
FIG. 3 is a cross-sectional view of the filter taken at a horizontal plane passing through the center of the arrangement shown in FIG. 1.

As depicted in FIGS. 2 and 3, each of the pole pieces D comprises a radially inwardly extending portion 8 which passes snugly through an opening 4 in the ceramic ring E and terminates in a pole face 10. Radially outward of the portion 8 is an integral wider portion 12 adapted to engage a bearing surface 6 of the ceramic supporting structure E. Extending radially outwardly from the portion 12 is an integral narrower portion 14 on which a magnetic field-producing winding 16 is mounted. That winding is enclosed within a shielding spool 18 and surrounded by an electrical shield 20 and cover 21, being held in place on its pole piece by the "0" ring 22 which engages a groove 23 formed in the circumference at the top and bottom of the outermost portion of the pole piece. An insulating shim 24 may be positioned between the shielded coil assembly and the pole piece portion 12. Electrical connection to the winding 16 is made by means of the terminals 26 extending through the cover 21. Each pole piece D is preferably of one-piece construction.

Figure 4:
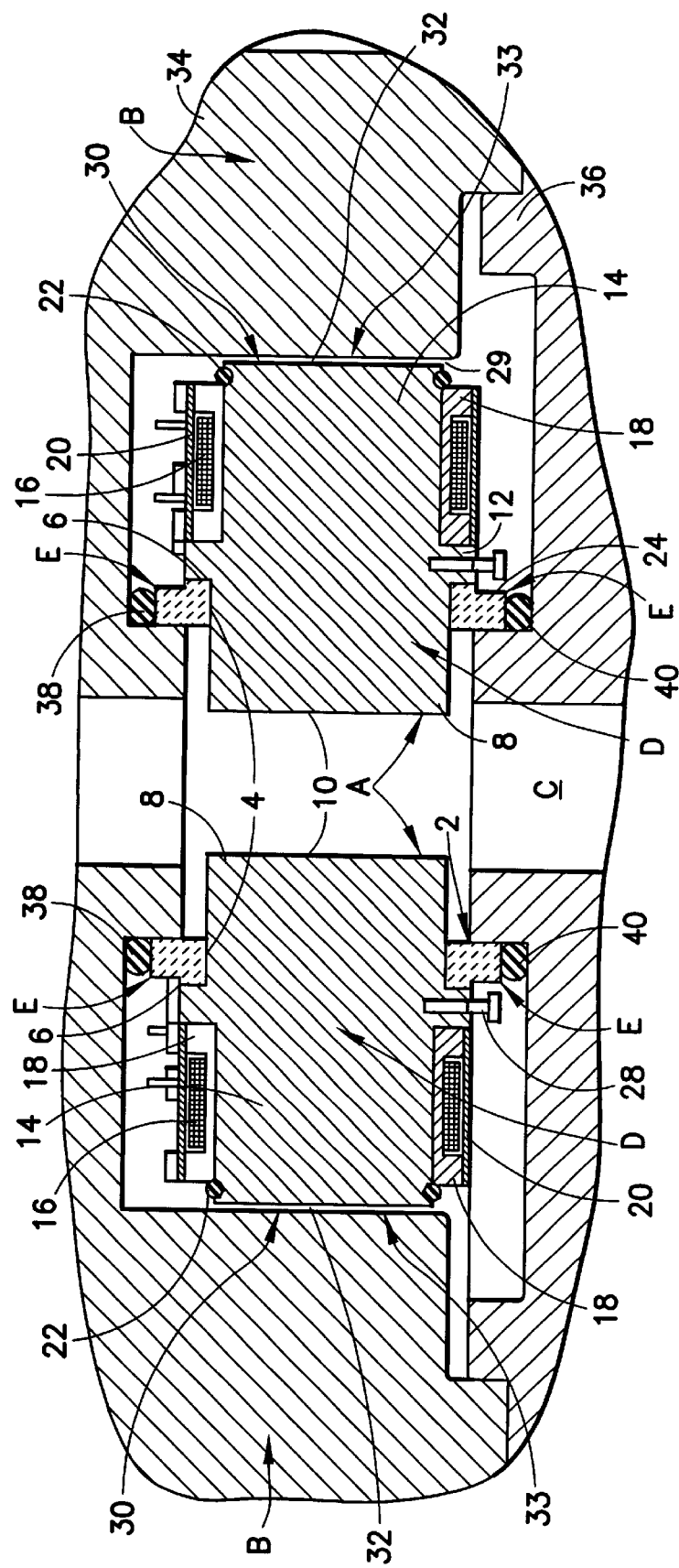
FIG. 4 is a cross-sectional view taken at a vertical plane passing through the center of the arrangement shown in FIG. 1 showing pole pieces of the filter mounted in an external magnetic structure (not shown in FIG. 1) which, in part, defines the evacuated passage through which the particles to be detected pass.

As may be seen from FIG. 4, each pole piece has extending laterally therefrom a terminal 28 in the form of a screw which, when appropriately energized, produces in the passage C the electrostatic field that, when functioning in conjunction with the magnetic field generated by the winding 16, gives rise to the desired Wien filter effect. Electrical connections to the terminals 26 and 28 can be made through field clamp B in any well known manner.

FIG. 4 shows two diametrically opposing pole pieces D incorporated into an SEM and located inside a magnetic field clamp structure B which magnetically links the pole pieces D and which also at least partly defines the particle passage C. The gap 29 needed in the magnetic circuit for electrical isolation is formed between the outer tips 30 of the pole pieces and the mating inwardly facing surfaces 32 of the magnetic field clamp structure B. A thin insulator 33 about ²⁄₁₀₀₀th of an inch thick is designed to be mounted in that gap.

The gap 29 in the magnetic circuit is necessary but it presents a problem from a magnetic point of view. The gap distorts the magnetic field where the gap exists, and that effect extends through space so as to perturb the field that the electrons pass through, thus adversely affecting the resolution of the instrument. By locating the gap 29 at the outer tips 30 of the pole pieces D, and hence remote from the passage C through which the electrons pass, the field-disturbing effect of the gap 29 is greatly minimized, and hence the resolution of the instrument is significantly improved.

The surfaces 32 facing the radially outer tips 30 of the pole pieces are formed in one magnetic structural section 34 of the field clamp structure B which, in turn, is mounted on a cooperating supporting field clamp structure section 36, those sections 34 and 36 as shown in FIG. 4 being portions of the overall microscope structure. The Wien filter ceramic supporting structure E rests on the field clamp structure 36 and engages the field clamp structure 34 at the radially outer pole piece tips 30. "O" rings 38 and 40 are compressed between the ceramic structure E and the field clamp structures 34 and 36 so as to maintain a vacuum in passage C.

The pole pieces D are formed of a highly magnetically permeable material. The shim 24 is formed of any suitably electrically insulating material such as polyamide available from DuPont under the trademark Kapton. The spool 18 may be formed of brass, the shield 20 may be formed of aluminum and the cover 21 may be formed of copper-clad insulating board.

The pole pieces D are secured to the supporting ceramic ring E by brazing the surface 6 of the ceramic ring E, after being appropriately metallized, to the opposed face of portions 12 of the pole pieces D while the pole pieces D are uniformly pressed into position. A fixture and method to accomplish this assembly are disclosed in a co-pending patent application entitled "A Fixture for Assembling Parts of an Instrument such as a Wien Filter", Ser. No. 10/011007 filed on Nov. 8, 2001, and assigned to the assignee of this application. A copper-silver-eutectic is very effective as the brazing material. In that regard a 1-mil thick brazing shim may be used. The brazing, it will be noted, not only reliably secures the pole pieces D in place on the supporting ring E but also produces the necessary hermetic seal between the ring E and the pole pieces D. The large areas of the brazed surfaces are important for sealing and for stability of the structural relationship.

Whereas, as pointed out above, wider portions 12 provide a substantial surface of engagement between each pole piece D and ceramic ring D, they serve another advantageous purpose as well. More specifically, the portions which extend like a flange around the main body of each pole piece provide some degree of shielding between the primary beam and the fringe field at gap 29 to even further reduce its perturbational effect on resolution of the instrument.

Although the detailed description provided above discusses specific embodiments of the present invention, various modifications thereto will be readily apparent to anyone with ordinary skill in the art. All such modifications are intended to fall within the scope of the present invention as defined by the following claims.

We claim:

1. An electromagnetic filter comprising a field-producing structure at least partly surrounding a passage, the improvement comprising:
   a supporting structure around said passage and having a plurality of inwardly extending openings therethrough;
   a plurality of magnetically permeable field-producing structures, each extending continuously through one of said openings, terminating at one end in a pole face located radially inwardly from said supporting structure and constituted at its other end by a portion extending radially outwardly from said supporting structure, each of said field-producing structures engaging said supporting structure;
   electromagnetic field-producing elements operatively connected to the radially outwardly extending portions of said field-producing structures and effective to act on said field-producing structures to produce magnetic and/or electric fields emanating therefrom and extending into said passage;
   said filter being adapted to function in combination with magnetic circuit means located outside said supporting structure operatively engaging and coupling the radially outwardly extending portions of said field-producing structures with a gap between said field-producing structures and said magnetic circuit means, said gap being located radially outside said supporting structure.

2. The filter of claim 1, wherein said gap is located radially outside said field-producing elements.

3. The filter of claim 2, wherein each of said field-producing elements comprises a magnetic coil surrounding the radially outwardly extending portion of each of said field-producing structures for producing a magnetic field in said passage.

4. The filter of claim 2, wherein each of said field-producing element comprises a magnetic coil surrounding the radially outwardly extending portion of each of said field-producing structures for producing a magnetic field in said passage, and means connected to such field-producing structures for causing them to produce an electrostatic field in said passage.

5. The filter of claim 2, wherein said supporting structure further comprises radially outwardly facing first bearing surfaces surrounding said openings, and wherein said field-producing structures further comprise second bearing surfaces respectively mating with said second bearing surfaces, said mated first and second bearing surfaces being brazed to one another.

6. The filter of claim 1, wherein said supporting structure is ring-shaped, the openings therein are essentially radially oriented, and the field-producing structures comprise a radially narrow portion extending through and projecting inwardly from its associated opening in said supporting structure and, integral therewith, a wider portion extending radially outwardly, physically engaging said supporting structure around the opening therein, and having mounted on that radially outwardly extending part a magnetic field-producing coil, said magnetic circuit means with which said filter is adapted to function extending between the radially outer portions of said field-producing structures with gaps between said magnetic circuit means and said radially outwardly extending portions of said field-producing structures, respectively.

7. The filter of claim 1, wherein said supporting structure is ring-shaped, the openings therein are essentially radially oriented, and the field-producing structures comprise a radially narrow portion extending through and projecting inwardly from its associated opening in said supporting structure and, integral therewith, a wider portion extending radially outwardly, physically engaging said supporting structure around the opening therein, and having mounted on that radially outwardly extending part a magnetic field-producing coil, said magnetic circuit means with which said filter is adapted to function extending between the radially outer portions of said field-producing structures with gaps between said magnetic circuit means and said radially outer portions of said field-producing structures respectively and radially outside said coils.

8. The filter of claim 6 in combination with said magnetic circuit means, wherein said magnetic circuit means extends around all other components of said filter structure so as to produce a second passage aligned and communicating with said passage through said supporting structure, and hermetic sealing means between said magnetic circuit means and all other components of said filter.

9. The filter of claim 7 in combination with said magnetic circuit means, wherein said magnetic circuit means extends around all other components of said filter structure so as to produce a second passage aligned and communicating with said passage through said supporting structure, and hermetic sealing means between said magnetic circuit means and all other components of said filter.

10. The filter of claim 1, wherein each of said field-producing elements comprises a magnetic coil surrounding the radially outwardly extending portion of each of said field-producing structures for producing a magnetic field in said passage.

11. The filter of claim 1, wherein each of said field-producing element comprises a magnetic coil surrounding the radially outwardly extending portion of each of said field-producing structures for producing a magnetic field in said passage, and means connected to such field-producing structures for causing them to produce an electrostatic field in said passage.

12. The filter of claim 1, wherein said supporting structure further comprises radially outwardly facing first bearing surfaces surrounding said openings, and wherein said field-producing structures further comprise second bearing surfaces respectively mating with said second bearing surfaces, said mated first and second bearing surfaces being brazed to one another.

13. An electromagnetic filter for use with an electrical instrument emitting a beam of charged particles from a surface to be measured and having a passage through which pass the charged particles, the filter comprising:

a supporting structure at least partly surrounding the passage and having a plurality of inwardly extending openings therethrough;

a plurality of magnetically permeable field-producing structures, each extending continuously through one of said openings, terminating at one end in a pole face located radially inwardly from said supporting structure and constituted at its other end by a portion extending radially outwardly from said supporting structure, each of said field-producing structures engaging said supporting structure;

electromagnetic field-producing means operatively connected to the radially outwardly extending portions of said field-producing structures and effective to act on said field-producing structures to produce magnetic and/or electric fields emanating therefrom and extending into said passage;

said filter being adapted to function in combination with magnetic circuit means located outside said supporting structure operatively engaging and coupling the radially outwardly extending portions of said field-producing structures with a gap between said field-producing structures and said magnetic circuit means, said gap being located radially outside said supporting structure.

14. The filter of claim 13, wherein said gap is located radially outside said field-producing means.

15. The filter of claim 13, wherein said field-producing means comprises a magnetic coil surrounding the radially outwardly extending portion of each of said field-producing structures for producing a magnetic field in said passage.

16. The filter of claim 13, wherein said field-producing means comprises a magnetic coil surrounding the radially outwardly extending portion of each of said field-producing structures for producing a magnetic field in said passage, and means connected to such field-producing means for causing them to produce an electrostatic field in said passage.

17. The filter of claim 13, wherein said supporting structure further comprises radially outwardly facing first bearing surfaces surrounding said openings, and wherein said field-producing structures further comprise second bearing surfaces respectively mating with said second bearing surfaces, said mated first and second bearing surfaces being brazed to one another.

18. The filter of claim 13, wherein said supporting structure is ring-shaped, the openings therein are essentially radially oriented, and the field-producing structures comprise a radially narrow portion extending through and projecting inwardly from its associated opening in said supporting structure and, integral therewith, a wider portion extending radially outwardly, physically engaging said supporting structure around the opening therein, and wherein said field-producing means is mounted on that radially outwardly extending part and comprises a magnetic field-producing coil, said magnetic circuit means with which said filter is adapted to function extending between the radially outer portions of said field-producing structures with gaps between said magnetic circuit means and said radially outwardly extending portions of said field-producing structures, respectively.

19. The filter of claim 13, wherein said supporting structure is ring-shaped, the openings therein are essentially radially oriented, and the field-producing structures comprise a radially narrow portion extending through and projecting inwardly from its associated opening in said supporting structure and, integral therewith, a wider portion extending radially outwardly, physically engaging said supporting structure around the opening therein, and wherein said field-producing means is mounted on that radially outwardly extending part and comprises a magnetic field-producing coil, said magnetic circuit means with which said filter is adapted to function extending between the radially outer portions of said field-producing structures with gaps between said magnetic circuit means and said radially outer portions of said field-producing structures respectively and radially outside said coils.

20. The filter of claim 18 in combination with said magnetic circuit means, wherein said magnetic circuit means extends around all other components of said filter structure so as to produce a second passage aligned and communicating with said passage through said supporting structure, and hermetic sealing means between said magnetic circuit means and all other components of said filter.

21. The filter of claim 19 in combination with said magnetic circuit means, wherein said magnetic circuit means extends around all other components of said filter structure so as to produce a second passage aligned and communicating with said passage through said supporting structure, and hermetic sealing means between said magnetic circuit means and all other components of said filter.

* * * * *